(12) United States Patent
Wu et al.

(10) Patent No.: US 7,935,278 B2
(45) Date of Patent: May 3, 2011

(54) FEATURE FORMING PROCESS USING ACID-CONTAINING COMPOSITION

(75) Inventors: Yiliang Wu, Oakville (CA); Mahya Mokhtari, Toronto (CA)

(73) Assignee: Xerox Corporation, Norwalk, CT (US)

( * ) Notice: Subject to any disclaimer, the term of this patent is extended or adjusted under 35 U.S.C. 154(b) by 323 days.

(21) Appl. No.: 12/398,611

(22) Filed: Mar. 5, 2009

(65) Prior Publication Data
US 2010/0224837 A1 Sep. 9, 2010

(51) Int. Cl.
*H01B 1/22* (2006.01)
*H01B 1/02* (2006.01)
*B05D 5/12* (2006.01)

(52) U.S. Cl. .................. 252/514; 252/520.3; 427/125
(58) Field of Classification Search .............. 252/514, 252/520.3; 427/125
See application file for complete search history.

(56) References Cited

U.S. PATENT DOCUMENTS

| | | | |
|---|---|---|---|
| 4,048,405 A | 9/1977 | Megahed | |
| 5,492,653 A * | 2/1996 | Hochheimer et al. | 252/514 |
| 6,060,165 A * | 5/2000 | Asada et al. | 428/403 |
| 7,270,694 B2 | 9/2007 | Li et al. | |
| 7,443,027 B2 | 10/2008 | Wu et al. | |
| 7,494,608 B2 * | 2/2009 | Li et al. | 252/514 |
| 2008/0020572 A1 * | 1/2008 | Wu et al. | 438/686 |
| 2008/0160183 A1 * | 7/2008 | Ide et al. | 427/126.5 |
| 2009/0140336 A1 * | 6/2009 | Li | 257/347 |

OTHER PUBLICATIONS

Yiliang Wu et al., "Feature Forming Process Using Plasma Treatment", filing date, U.S. Appl. No. 12/398,627.
T.M. Hammad et al., "The Effect of Different Plasma Treatments on the Sheet Resistance of Sol-gel ITO and ATO Thin Films," *Chinese Journal of Physics*, vol. 40, No. 5, pp. 532-536 (Oct. 2002).

* cited by examiner

*Primary Examiner* — Mark Kopec
*Assistant Examiner* — Jaison P Thomas
(74) *Attorney, Agent, or Firm* — Zosan Soong

(57) ABSTRACT

A process including: (a) forming a feature comprising uncoalesced silver-containing nanoparticles; (b) heating the uncoalesced silver-containing nanoparticles to form coalesced silver-containing nanoparticles wherein the feature comprising the coalesced silver-containing nanoparticles exhibits a low electrical conductivity; and (c) subjecting the coalesced silver-containing nanoparticles to an acid-containing composition to increase the electrical conductivity of the feature by at least about 100 times.

20 Claims, 2 Drawing Sheets

US 7,935,278 B2

FEATURE FORMING PROCESS USING ACID-CONTAINING COMPOSITION

CROSS-REFERENCE TO RELATED APPLICATIONS

Yiliang Wu et al., "FEATURE FORMING PROCESS USING PLASMA TREATMENT" Ser. No. 12/398,627, filed Mar. 5, 2009.

BACKGROUND OF THE INVENTION

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), large-area flexible displays and signages, radio frequency identification (RFID) tags, photovoltaics, sensors, and the like. However, the deposition and/or patterning of functional electrodes, pixel pads, and conductive traces, lines and tracks which meet the conductivity, processing, and cost requirements for practical applications have been a great challenge.

Solution-processable conductors are of great interest for use in such electronic applications. Metal nanoparticle-based inks represent a promising class of materials for printed electronics. Some metal nanoparticles such as silver-containing nanoparticles may suffer from instability issue when stored in ambient atmosphere. There is an urgent need addressed by embodiments of the present invention to process such metal nanoparticle into highly conductive features.

Moreover, in order to stabilize metal nanoparticles, large or bulky stabilizers are often used, which usually results in high processing temperature and long processing time. These are not compatible with plastic substrate such as polyethylene terephthalate (PET) and fast manufacturing process. Therefore, there is a need addressed by embodiments of the present invention to develop a process that decreases processing temperature and/or shortens processing time.

The conventional method ("Conventional Method"), disclosed for example in U.S. Pat. Nos. 7,443,027 and 7,270,694, to form a highly electrically conductive feature comprising coalesced silver-containing nanoparticles for electronic circuit elements involves: forming a feature comprising uncoalesced silver-containing nanoparticles on a suitable substrate and heating the uncoalesced silver-containing nanoparticles to form coalesced silver-containing nanoparticles (wherein there is absent from the Conventional Method the use of the plasma treatment and acid-containing composition treatment described herein for embodiments of the present invention). This Conventional Method may not be able to achieve high electrical conductivity for aged silver-containing nanoparticles. Moreover, the Conventional Method may not be able to achieve high electrical conductivity at a lower temperature and shorter processing time for some applications such as a high speed manufacturing flexible device on PET substrate. In embodiments, the present invention addresses shortcomings of the Conventional Method.

The following documents provide background information:

Yiliang Wu et al., U.S. Pat. No. 7,443,027.
Yuning Li et al., U.S. Pat. No. 7,270,694.
El Sayed Megahed, U.S. Pat. No. 4,048,405.

T. M. Hammad et al., "The Effect of Different Plasma Treatments on the Sheet Resistance of Sol-gel ITO and ATO Thin Films," *Chinese Journal of Physics*, Vol. 40, No. 5, pp. 532-536 (Oct. 2002).

SUMMARY OF THE DISCLOSURE

In embodiments, there is provided a process comprising:
(a) forming a feature comprising uncoalesced silver-containing nanoparticles;
(b) heating the uncoalesced silver-containing nanoparticles to form coalesced silver-containing nanoparticles wherein the feature comprising the coalesced silver-containing nanoparticles exhibits a low electrical conductivity; and
(c) subjecting the coalesced silver-containing nanoparticles to an acid-containing composition to increase the electrical conductivity of the feature by at least about 100 times.

In other embodiments, there is provided a process comprising:
(a) forming a feature comprising uncoalesced silver-containing nanoparticles;
(b) heating the uncoalesced silver-containing nanoparticles to form coalesced silver-containing nanoparticles wherein the feature comprising the coalesced silver-containing nanoparticles exhibits a low electrical conductivity; and
(c) subjecting the coalesced silver-containing nanoparticles to a carboxylic acid to increase the electrical conductivity of the feature by at least about 1000 times.

In further embodiments, there is provided a process to form a conductive feature from silver-containing nanoparticles while using a heating temperature lower than that employed in a conventional method, the process including:
(a) forming a feature comprising uncoalesced silver-containing nanoparticles;
(b) heating the uncoalesced silver-containing nanoparticles to form coalesced silver-containing nanoparticles at a heating temperature at least about 10 degrees C. lower than that used in the conventional method, wherein the feature comprising the coalesced silver-containing nanoparticles exhibits a low electrical conductivity; and
(c) subjecting the coalesced silver-containing nanoparticles to an acid-containing composition.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
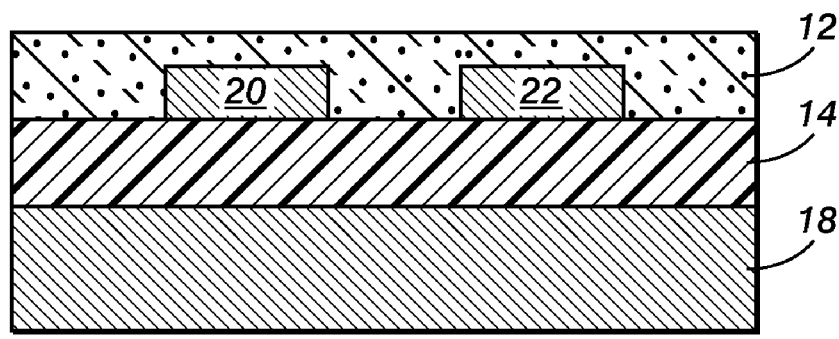
FIG. 1 represents a first embodiment of a thin film transistor wherein the conductive features were made using the present process.

The term "nano" as used in "nanoparticles" refers to, for example, a particle size of less than about 1,000 nm, such as, for example, from about 0.5 nm to about 1,000 nm, for example, from about 1 nm to about 500 nm, from about 1 nm to about 100 nm, from about 1 nm to about 25 nm or from about 1 to about 10 nm. The particle size refers to the average diameter of the silver-containing nanoparticles, as determined by TEM (transmission electron microscopy) or other suitable method.

The phrase "fresh silver-containing nanoparticles" refers to silver-containing nanoparticles capable of resulting in a highly conductive feature using the Conventional Method wherein the silver-containing nanoparticles are used within a relatively short timeframe after their production (e.g., less than about three weeks).

The phrase "aged silver-containing nanoparticles" refers to silver-containing nanoparticles incapable of resulting in a highly conductive feature using the Conventional Method wherein the silver-containing nanoparticles are used within a relatively longer timeframe after their production (e.g., more than three weeks).

The phrase "uncoalesced silver-containing nanoparticles" refers to silver-containing nanoparticles having the same or similar particle size as prepared.

The phrase "coalesced silver-containing nanoparticles" refers to the silver-containing nanoparticles having increased particle size where several uncoalesced nanoparticles are fused together. In embodiments, however, distinct particle contours may no longer be visible in the "coalesced silver-containing nanoparticles."

Any suitable silver-containing nanoparticles may be used including the silver-containing nanoparticles (and process for their preparation) described in for instance Yuning Li et al., U.S. Pat. No. 7,270,694, the disclosure of which is totally incorporated herein by reference.

In embodiments, the present process comprises forming a feature comprising uncoalesced silver-containing nanoparticles on a suitable substrate, heating the uncoalesced silver-containing nanoparticles to form coalesced silver-containing nanoparticles, and subjecting the feature to a plasma treatment prior to, during or after the heating, wherein the resulting feature exhibits an electric conductivity at least 100 times higher than the feature made without the plasma treatment (that is, using the Conventional Method).

In other embodiments, the present process comprises forming a feature comprising uncoalesced silver-containing nanoparticles on a suitable substrate, heating the uncoalesced silver-containing nanoparticles to form coalesced silver-containing nanoparticles, and subjecting the coalesced silver-containing nanoparticles to an acid-containing composition (also referred herein as "acid treatment") to increase the electric conductivity of the feature by at least 100 times higher than the feature made without the acid treatment (that is, using the Conventional Method).

In contrast to the Conventional Method, the present process in embodiments has several advantages: first, the present process enables a lower processing temperature and/or shorter heating (annealing) time than the Conventional Method to achieve the same conductivity. For some unstable silver-containing nanoparticles such as aged silver-containing nanoparticles, while the Conventional Method cannot yield high electrical conductivity, the invented process could yield high electrical conductivity which is at least 100 times than that resulting from the Conventional Method.

In embodiments, the silver-containing nanoparticles are composed of elemental silver or a silver composite. Besides silver, the silver composite includes either or both of (i) one or more other metals and (ii) one or more non-metals. Suitable other metals include for example Al, Au, Pt, Pd, Cu, Co, Cr, In, and Ni, particularly the transition metals for example Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include for example Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the silver-containing nanoparticles do not include the stabilizer.

The silver-containing nanoparticles may also contain an organic stabilizer that is connected to the surface of the nanoparticles. In embodiments, the stabilizer is physically or chemically associated with the surface of the nanoparticles. In this way, the nanoparticles have the stabilizer thereon outside of a liquid solution. That is, the nanoparticles with the stabilizer thereon may be isolated and recovered from a reaction mixture solution used in forming the nanoparticles and stabilizer. The stabilized nanoparticles may thus be subsequently readily and homogeneously dispersed in a solvent for forming a printable solution. As used herein, the phrase "physically or chemically associated" between the metal nanoparticles and the stabilizer can be a chemical bond and/or other physical attachment. The chemical bond can take the form of, for example, covalent bonding, hydrogen bonding, coordination complex bonding, or ionic bonding, or a mixture of different chemical bonds. The physical attachment can take the form of, for example, van der Waals' forces or dipole-dipole interaction, or a mixture of different physical attachments.

The term "organic" in "organic stabilizer" refers to, for example, the presence of carbon atom(s), but the organic stabilizer may include one or more non-metal heteroatoms such as nitrogen, oxygen, sulfur, silicon, halogen, and the like. The organic stabilizer may be an organoamine stabilizer such as those describe in U.S. Pat. No. 7,270,694, which is incorporated by reference herein in its entirety. Examples of the organoamine are an alkylamine, such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

Examples of other organic stabilizers include, for example, thiol and its derivatives, —OC(=S)SH (xanthic acid), carboxylic acids, polyethylene glycols, polyvinylpyridine, polyninylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. The organic stabilizer may be selected from the group consisting of a carboxylic acid such as butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof Organic stabilizers containing a pyridine derivative (for example, dodecyl pyridine) and/or organophosphine that can stabilize metal nanoparticles may also be used as a potential stabilizer.

The extent of the coverage of stabilizer on the surface of the nanoparticles can vary, for example, from partial to full coverage depending on the capability of the stabilizer to stabilize the nanoparticles. Of course, there is variability as well in the extent of coverage of the stabilizer among the individual nanoparticles.

The weight percentage of the optional stabilizer in the nanoparticle may be from, for example, about 5 weight percent to about 60 weight percent, from about 10 weight percent to about 40 weight percent or from about 15 weight percent to about 30 weight percent of the total weight of the nanoparticles and the stabilizers.

The silver-containing nanoparticles can be dispersed or dissolved in any suitable liquid to form a liquid composition comprising the silver-containing nanoparticles. Such liquid composition can be deposited with any suitable method on a suitable substrate to form a feature comprising uncoalesced silver-containing nanoparticles.

In embodiments, the liquid comprising one or more solvents including, water, hydrocarbon solvent, alcohol, ketone, chlorinated solvent, ester, ether, and the like. Suitable hydrocarbon solvent includes an aliphatic hydrocarbon having at least 5 carbon atoms to about 20 carbon atoms, such as pentane, hexane, heptane, octane, nonane, decane, undecane, dodecane, tridecane, tetradecane, pentadecane, hexadecane, heptadecane, dodecene, tetradecene, hexadecene, heptadecene, octadecene, terpinenes, isoparaffinic solvents, and their isomers; an aromatic hydrocarbon having from about 7 carbon atoms to about 18 carbon atoms, such as toluene, xylene, ethyltoluene, mesitylene, trimethylbenzene, diethylbenzene, tetrahydronaphthalene, ethylbenzene, and their isomers and mixtures. Suitable alcohol has at least 6 carbon atoms and can be, for example, hexanol, heptanol, octanol, nonanol, decanol, undecanol, dodecanol, tetradecanol, and hexadecanol; a diol such as hexanediol, heptanediol, octanediol, nonanediol, and decanediol; an alcohol comprising an unsaturated double bond, such as farnesol, dedecadienol, linalool, geraniol, nerol, heptadienol, tetradecenol, hexadeceneol, phytol, oleyl alchohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, cresol, trimethylcyclohexenol; and the like. If two or more solvents are used, the solvents are at any suitable ratio. For example, the hydrocarbon and the alcohol solvent can be a ratio from about 5:1 to about 1:5.

The silver-containing nanoparticles (along with stabilizer, if any) may be from about 10 to about 80 weight percent of the liquid composition, including from about 15 to about 60 weight percent of the liquid composition. The liquid composition is deposited with any "liquid deposition techniques", including liquid coating processes, for example, spin coating, blade coating, rod coating, dip coating, and the like; printing techniques, for example, lithography or offset printing, gravure, flexography, screen printing, stencil printing, inkjet printing, stamping (such as microcontact printing), and the like. In embodiments, the liquid composition is an ink composition and the deposition technique is inkjet printing. An illustrative ink composition is disclosed in U.S. application Ser. No. 12/331,573, the disclosure of which is totally incorporated herein by reference.

The substrate upon which the silver-containing nanoparticles are deposited may be any suitable substrate, including, for example, silicon, glass plate, plastic film, sheet, fabric, or paper. For structurally flexible devices, plastic substrates, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon. The substrate can be bare substrate or substrate with pre-deposited layer or layers such as conducting layer, semiconducting layer, insulating layer such as dielectric layer, planarization layer, encapsulation layer, and the like.

With the liquid deposition technique, a feature comprising uncoalesced silver-containing nanoparticles is first formed. The feature can be any shape such as line, dot, and film in any suitable size. The feature has a thickness ranging from about 5 nanometers to about 5 millimeters, preferably from about 10 nanometers to about 1000 micrometers. The uncoalesced silver-containing nanoparticles feature at this stage may or may not exhibit appreciable electrical conductivity.

Heating the uncoalesced silver-containing nanoparticles at a temperature of, for example, at or below about 200° C., such as, for example, from about 80° C. to about 180° C., from about 100° C. to about 180° C., from about 100° C. to about 140° C. and from about 80° C. to about 120° C., to induce the silver-containing nanoparticles or "anneal" the silver-containing nanoparticles to form coalesced silver-containing nanoparticles. In embodiments, the coalesced silver-containing nanoparticles may or may not have appreciable electrical conductivity. As used herein, the term "heating" encompasses any technique(s) that can impart sufficient energy to the heated material or substrate to (1) anneal the nanoparticles and/or (2) remove the optional stabilizer from the nanoparticles. Examples of heating techniques may include thermal heating (for example, a hot plate, an oven, and a burner), infra-red ("IR") radiation, a laser beam, microwave radiation, or UV radiation, or a combination thereof. The heating can be performed for a time ranging from, for example, 1 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars. In embodiments, the heating is performed in air at the normal atmospheric pressure.

In some embodiments, the feature comprising the coalesced silver-containing nanoparticles is subjected to an acid-containing composition to increase the electrical conductivity of the feature. The term "subject" refers to exposure to, including immersing in, washing or rinsing with the acid containing composition, or spreading, coating, and printing acid-containing composition on the feature. In some embodiments, the substrate bearing the feature is immersed in the acid-containing composition. In other embodiments, the feature is washed or rinsed with the acid containing composition. In further embodiments, the acid-containing composition is deposited on top of the feature using any suitable deposition method, for example, spin coating, inkjet printing, spreading, and the like.

Any suitable acid or mixtures of acids (in any suitable ratio such as 50/50 by volume) can be used. In embodiments, the acid includes HCl, $HNO_3$, $H_2SO_4$, $HPO_3$, carboxylic acid having 2 to about 18 carbon atoms, and a mixture thereof. Representative carboxylic acids includes for example acetic acid, butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof.

The acid-containing composition comprises an optional solvent. Any suitable solvents may be used including water, alcohol, ketone, ether, ester, hydrocarbon solvent. The acid-containing composition has an acid from about 0.001 to 100 weight percent of the composition, including about 0.01 to about 50 weight percent, and from about 0.01 to about 10 weight percent of the composition. In an embodiment, a low concentration from about 0.001 to about 10 weight percent, including 0.01 to about 1 weight percent, is used.

The acid treatment is performed at any suitable temperature for example from room temperature to an elevated temperature about 100° C., including from room temperature to 60° C., preferably at room temperature. The acid treatment is performed for a period of from about 1 second to about 5 hours, including about 1 second to about 10 min, and about 1 second to about 3 min. A short treatment time from about 1 second to about 10 min, including 1 second to 3 min, may be used.

After the acid treatment, the feature comprising the coalesced silver-containing nanoparticles is optionally dried for example by heating or air-flow. The resulting feature has a high electrical conductivity for example at least 100 times higher than the feature before the acid treatment, including 1000 times and 10,000 times higher than the feature before the acid treatment.

In other embodiments, the feature is subjected to a plasma treatment. When subjected to the plasma treatment, the feature comprises the uncoalesced silver-containing nanoparticles or the coalesced silver-containing nanoparticles, or "both" the uncoalesced silver-containing nanoparticles and the coalesced silver-containing nanoparticles ("both" in the sense that the plasma treatment can occur while the heating changes the uncoalesced silver-containing nanoparticles to the coalesced silver-containing nanoparticles). Namely, the plasma treatment can be performed prior to, during, or after the heating. If the plasma treatment is performed prior to the heating, the feature may or may not have appreciable electrical conductivity (as measured after the plasma treatment but before the heating). However, after both the heating and plasma treatment, the resulting feature is highly conductive. The conductivity is at least 100 times, including 1000 times and 10,000 times, higher than a feature without the plasma treatment.

Any suitable plasma generator can be used for the plasma treatment. For example, the plasma cleaner from Harrick Plasma can be used. The tabletop plasma and plasma generator such as "Plasma-Spot" for production form GaLa Instrumente GmbH can also be used. The plasma generator can be from about 100 W to about 50 kW at a frequency from about 24 kHz to about 13.56 MHz. In some embodiments, the plasma generator is Radio Frequency emission type plasma. The ion energy is less than about 12.0 eV.

Any suitable plasma treatment can be used. In embodiments, the plasma includes air plasma, nitrogen plasma, Argon plasma, helium plasma, neon plasma, and the like. In embodiments, the plasma treatment is other than an oxygen plasma treatment. The plasma treatment is performed at any suitable temperature for example from room temperature to an elevated temperature such as the temperature used in the heating action, including about 100° C., also including from room temperature to 60° C., and especially at room temperature. It is performed for a period of from about 1 second to about 5 min, including about 1 second to about 2 min, and about 1 second to about 1 min. In embodiments, a short treatment time from about 1 second to about 2 min, including about 1 second to about 1 min, is used.

Any suitable silver-containing nanoparticles can be used. In embodiments, the silver-containing nanoparticles are aged silver-containing nanoparticles. Aging silver-containing nanoparticles in air will cause some adverse effect on the silver-containing nanoparticles due to the reaction of the particles with ambient oxygen, carbon dioxide, and/or water. Often the silver-containing nanoparticles will become not conductive or less conductive after heating. With the acid-containing composition treatment and/or plasma treatment, the conductivity could be significantly improved.

In embodiments, the present process uses fresh silver-containing nanoparticles. With the plasma treatment and/or acid treatment, the process using fresh silver-containing nanoparticles may in embodiments boost the electrical conductivity higher than that achieved by the Conventional Method (employing the same heating temperature and heating time as the Conventional Method).

In other embodiments, the present process using aged silver-containing nanoparticles and/or fresh silver-containing nanoparticles employs a lower heating temperature and/or shorter heating time compared with the Conventional Method but achieves similar electrical conductivity in the feature compared with the Conventional Method due to the use of the plasma treatment and/or acid treatment. Compared to the Conventional Method, in embodiments of the present process, the heating temperature is lowered by at least about 10 degree C., including lowered by at least about 20 degree C. Compared to the Conventional Method, in embodiments of the present process, the heating time is reduced by at least about 20 percent, including about 50 percent. For example, in order to achieve high conductivity of 10,000 S/cm using the Conventional Method for certain silver-containing nanoparticles, a heating temperature of at least 140 degree C. and heating time of at least 10 min may be required. In embodiments of the present process, for the same silver-containing nanoparticles, heating at a lower temperature such as about 120 degree C. for a shorter time of about 3 min is able to achieve similar conductivity. In comparisons between the Conventional Method and the present invention, the heating time and heating temperature for the Conventional Method are the minimum values (that is, shortest heating time/lowest heating temperature) that can effect coalescence for a particular type of silver-containing nanoparticles to achieve the required conductivity.

In embodiments, the conductive features prepared by the invented process have conductivity at least about 1000 S/cm, including at least 5000 S/cm and at least 10,000 S/cm. Conductivity could be determined by any suitable methods such as 4-point probe method. In embodiments, the present process with the plasma treatment and/or acid treatment increases the electrical conductivity of the feature by at least about 1000 times or about 3000 times or about 5000 times, compared with a feature produced by a process without the plasma treatment and acid treatment.

Besides the improvement of conductivity, and the decrease of annealing temperature and annealing times, the present invention in embodiments may yield a conductive feature with different surface properties such as a higher surface energy compared to the features formed by the Conventional Method. For certain silver-containing nanoparticles, the features formed by Conventional Method have a hydrophobic surface (low surface energy); on the other hand, the features formed by the invented process in embodiments have a hydrophilic surface (high surface energy). The surface property can be determined by contact angle measurement. In some situations, the features formed by the Conventional Method have an advancing water contact angle greater than about 80 degrees, including greater than 90 degrees. In contrast, the features formed by the invented process in embodiments have an advancing water contact angle less than about 70 degrees, including less than about 50 degrees. High surface energy would provide better adhesion for subsequent layers deposited on top of the conductive features.

In certain embodiments, either the plasma treatment or the acid treatment is used. In other embodiments, both the plasma treatment and the acid treatment are used.

Without limited to any theory, it is believed that the plasma treatment and/or the acid treatment on coalesced silver-containing nanoparticles is not only to remove residual amount of stabilizer or its decomposed components from the surface, but also reduce some insulative barrier inside the feature such as the grain boundary of the coalesced silver-containing nanoparticles. Plasma treatment on uncoalesced silver-containing nanoparticles could create defects at the surface of silver-containing nanoparticles which may enhance coalescence of the silver-containing nanoparticles upon heating.

In embodiments, the silver-containing nanoparticles can be used in for example, but not limited to, fabricating conductive features such as gate, source and drain electrodes in thin film transistor ("TFT").

In FIG. 1, there is schematically illustrated a TFT configuration 10 comprised of a heavily n-doped silicon wafer 18 which acts as both a substrate and a gate electrode, a thermally grown silicon oxide insulating layer 14 on top of which are deposited two metal contacts, source electrode 20 and drain electrode 22. Over and between the metal contacts 20 and 22 is an organic semiconductor layer 12.

Figure 2:
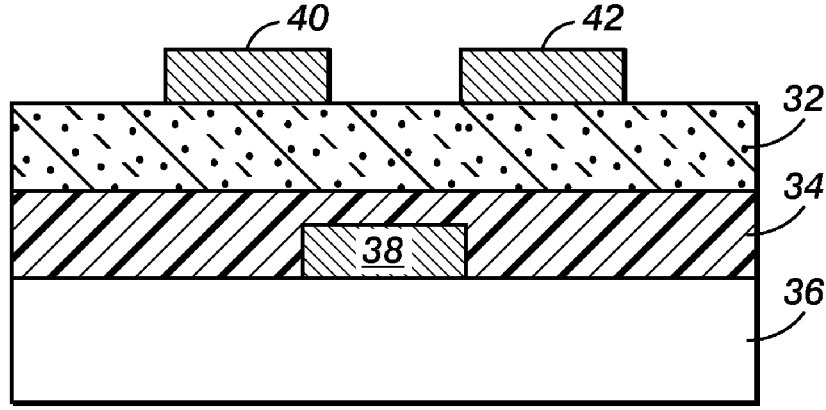
FIG. 2 represents a second embodiment of a thin film transistor wherein the conductive features were made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
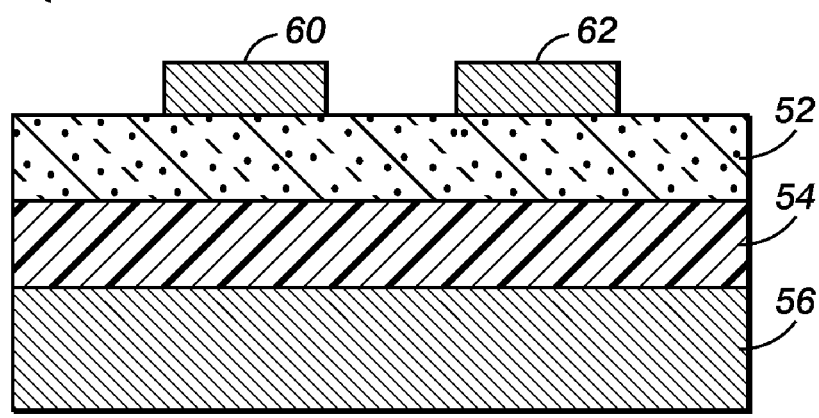
FIG. 3 represents a third embodiment of a thin film transistor wherein the conductive features were made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
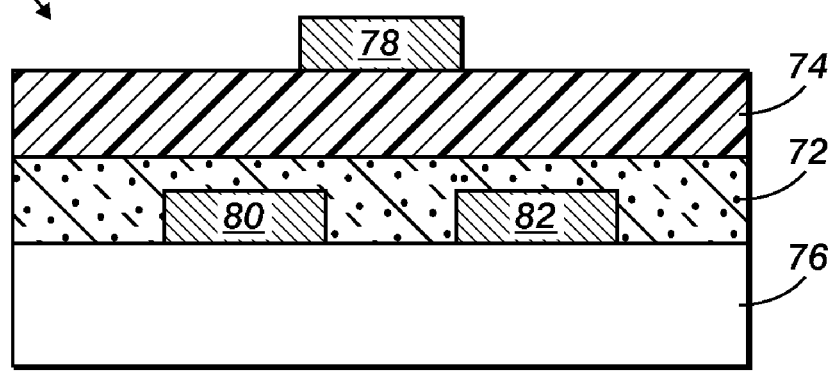
FIG. 4 represents a fourth embodiment of a thin film transistor wherein the conductive features were made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present invention. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in Beng Ong et al., US Patent Application Publication No. US 2003/0160230 A1; Beng Ong et al., US Patent Application Publication No. US 2003/0160234 A1; Beng Ong et al., US Patent Application Publication No. US 2003/0136958 A1; and "Organic Thin Film Transistors for Large Area Electronics" by C. D. Dimitrakopoulos and P. R. L. Malenfant, Adv. Mater., Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The invention will now be described in detail with respect to specific representative embodiments thereof, it being understood that these examples are intended to be illustrative only and the invention is not intended to be limited to the materials, conditions, or process parameters recited herein. All percentages and parts are by weight unless otherwise indicated. The phrases "room temperature" and "ambient temperature" refer to a temperature range of about 20 to about 25 degrees C. Unless otherwise indicated, "silver" nanoparticles refer to nanoparticles having elemental silver (that is, not a silver composite). For those Examples involving a plasma treatment, Harrick Plasma generator (PDC-32G) was used for the plasma treatment. This generator has an input power of 100 W.

COMPARATIVE EXAMPLE 1

Silver nanoparticles stabilized with hexadecylamine were used, which were aged for 3 months. 15 wt % solution of the nanoparticles in toluene was prepared and spin coated on a glass slide. After annealing at 140° C. for 3 min, conductivity of the resulted film was measured using 4-probe method to be $1.7 \times 10^{-1}$ S/cm.

EXAMPLE 1

The above low conductivity thin film was immersed in 0.1 M acetic acid solution in toluene for 5 min. After rinsing with toluene, the film was dried at 140° C. for 1 min, resulting in a highly conductive film with a conductivity of $2.84 \times 10^4$ S/cm. The conductivity was improved by 5 orders of magnitude.

EXAMPLE 2

Similar to Example 1, the low conductivity thin film was immersed in 0.02 M dilute acetic acid solution in toluene for 5 min. After rinsing with toluene, the film was dried at 140° C. for 1 min, giving a highly conductive thin film with conductivity of $2.21 \times 10^4$ S/cm. The conductivity was improved by 5 orders of magnitude, even with a very dilution acid solution.

COMPARATIVE EXAMPLE 2

Fresh silver nanoparticles stabilized with hexadecylamine were used. 15 wt % solution of the nanoparticles in toluene was prepared and spin coated on glass slides. After annealing at 140 C for 10, a high conductivity of $2.1 \times 10^4$ S/cm was observed. However, when annealed at 120° C. for 10 min, conductivity was detected to be $4.8 \times 10^{-2}$ S/cm.

EXAMPLE 3

This low conductivity thin film in Comparative Example 2 was immersed in 0.5 M acetic acid solution in toluene for 5 min. After rinsing with toluene, the film was dried at 120° C. for 1 min, giving a highly conductive thin film with conductivity of $2.4 \times 10^4$ S/cm, an improvement of 5-6 orders of magnitude. It also indicates that lower heating temperature can be used with the acid treatment process.

EXAMPLE 4

The aged silver nanoparticles were formulated as ink by dispersing the nanoparticles in a mixed solvent of dodecane and terpineol at 2:1 ratio. The silver nanoparticles loading was 40 wt %. Using inkjet printer, fine lines were jetted on glass substrate. The printed features were annealing at 120° C. for 10 min, followed by treatment with 0.02 M acetic acid solution in toluene for 5 min. Highly conductivity lines were obtained by using two-probe measurement. The acid treatment step had no damage to the printed fine lines.

EXAMPLE 5

Aged silver nanoparticles (3 weeks) were used. 15 wt % solution of the nanoparticles in toluene was prepared and spin coated on glass slides. After annealing at 140° C. for 3 min, conductivity of the resulted film was measured using 4-probe method to be ~$5.7 \times 10^{-1}$ S/cm, which is about 5 orders of magnitude lower than that of fresh sample (~$2 \times 10^4$ S/cm).

The low conductivity thin films were subjected to air plasma at room temperature for different time from 10 to 120 seconds as shown in the following table, and the conductivity was measured with 4-probe method again. The following table summarizes the values. As one can see, the conductivity was improved to the level of fresh sample (~$2 \times 10^4$ S/cm) with plasma treatment for less than 30 seconds. Longer treatment to 120 seconds had no adverse effect on conductivity.

|  | Time (s) | | | | | |
| --- | --- | --- | --- | --- | --- | --- |
|  | 0 | 10 | 20 | 30 | 60 | 120 |
| Conductivity (S/cm$^2$) | $5.7 \times 10^{-1}$ | $1.27 \times 10^4$ | $1.52 \times 10^4$ | $2.01 \times 10^4$ | $2.75 \times 10^4$ | $2.80 \times 10^4$ |

EXAMPLE 6

Similar to Example 5, the film was annealed at 120° C. for 10 min, followed by air plasma treatment for 1 min at room temperature. The resulted film showed conductivity as high as $2.45 \times 10^4$ S/cm.

EXAMPLE 7

Similar to Example 4, the printed features were annealing at 120° C. for 10 min, followed by air plasma treatment for 1 min. Highly conductivity lines were obtained by using two-probe measurement.

EXAMPLE 8

Aged silver nanoparticles were used. 15 wt % solution of the nanoparticles in toluene was prepared and spin coated on glass slides. The spin coating film was subject to air plasma for 1 min at room temperature. Conductivity of the plasma treated film was measured to be $8.4 \times 10^{-3}$ S/cm. After the treatment, the film was annealed at 140° C. for 3 min. The resulted film showed conductivity as high as $1.8 \times 10^4$ S/cm. This revealed that plasma treatment prior to heating could also effectively improve the conductivity.

EXAMPLE 9

Similar to Example 5, the low conductive films were subject to nitrogen or argon plasma for 1 min at room temperature. Both films showed high conductivity over $10^4$ S/cm.

COMPARATIVE EXAMPLE 3

Similar to Example 6, silver nanoparticle thin-film was annealed at 120° C. for 10 min, followed by irradiation with UV light for 7 min. (UV treatment is known as a surface cleaning method.) The resulted film showed very low conductivity which is the same as that before treatment, indicating that UV treatment has no improvement on conductivity of the film.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process comprising:
   (a) forming a feature comprising uncoalesced silver-containing nanoparticles;
   (b) heating the uncoalesced silver-containing nanoparticles to form coalesced silver-containing nanoparticles wherein the feature comprising the coalesced silver-containing nanoparticles exhibits a low electrical conductivity; and
   (c) subjecting the coalesced silver-containing nanoparticles to an acid-containing composition to increase the electrical conductivity of the feature by at least about 100 times.

2. The process of claim 1, wherein the heating occurs for a period of time ranging from about 2 seconds to about 20 minutes.

3. The process of claim 1, wherein the heating occurs for less than about 5 minutes.

4. The process of claim 1, wherein the heating occurs at a temperature less than about 150° C.

5. The process of claim 1, wherein the heating occurs at a temperature less than about 120° C.

6. The process of claim 1, wherein the action (c) increases the electrical conductivity of the feature by at least about 1000 times.

7. The process of claim 1, wherein the action (c) increases the electrical conductivity of the feature by at least about 3000 times.

8. The process of claim 1, wherein the coalesced silver-containing nanoparticles is subjected to the acid-containing composition at a temperature from room temperature to about 60 degree C. for a period of about 1 second to about 10 min.

9. The process of claim 1, wherein the uncoalesced silver-containing nanoparticles include molecules of an organoamine stabilizer on the surface of the uncoalesced silver-containing nanoparticles.

10. The process of claim 1, wherein the silver-containing nanoparticles are aged silver-containing nanoparticles.

11. The process of claim 1, wherein the silver-containing nanoparticles are fresh silver-containing nanoparticles.

12. The process of claim 1, wherein the acid-containing composition includes a carboxylic acid.

13. A process comprising:
   (a) forming a feature comprising uncoalesced silver-containing nanoparticles;
   (b) heating the uncoalesced silver-containing nanoparticles to form coalesced silver-containing nanoparticles wherein the feature comprising the coalesced silver-containing nanoparticles exhibits a low electrical conductivity; and
   (c) subjecting the coalesced silver-containing nanoparticles to a carboxylic acid to increase the electrical conductivity of the feature by at least about 1000 times.

14. The process of claim 13, wherein the heating occurs for less than about 5 minutes.

15. The process of claim 13, wherein the heating occurs at a temperature less than about 120° C.

16. The process of claim 13, wherein the action (c) increases the electrical conductivity of the feature by at least about 3000 times.

17. The process of claim 13, wherein the uncoalesced silver-containing nanoparticles include molecules of an organoamine stabilizer on the surface of the uncoalesced silver-containing nanoparticles.

18. The process of claim 13, wherein the silver-containing nanoparticles are aged silver-containing nanoparticles.

19. The process of claim 13, wherein the silver-containing nanoparticles are fresh silver-containing nanoparticles.

20. The process of claim 13, wherein the carboxylic acid has 2 to about 18 carbon atoms.

* * * * *